(12) United States Patent
Chiba

(10) Patent No.: US 8,395,121 B2
(45) Date of Patent: Mar. 12, 2013

(54) VISIBLE-REGION LIGHT MEASURING INSTRUMENT AND VISIBLE-REGION LIGHT MEASURING INSTRUMENT MANUFACTURING METHOD

(75) Inventor: Tadashi Chiba, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 572 days.

(21) Appl. No.: 12/561,119

(22) Filed: Sep. 16, 2009

(65) Prior Publication Data

US 2010/0072369 A1    Mar. 25, 2010

(30) Foreign Application Priority Data

Sep. 22, 2008    (JP) ................................ 2008-243078

(51) Int. Cl.
*G01J 5/02* (2006.01)
(52) U.S. Cl. ............ 250/339.05; 250/338.4; 250/339.01
(58) Field of Classification Search ............... 250/338.1, 250/338.4, 339.01, 339.05, 349; 257/431, 257/432, 435
See application file for complete search history.

(56) References Cited

U.S. PATENT DOCUMENTS

| 7,838,811 B2 * | 11/2010 | Otsuka et al. ........... 250/214 AL |
| 2009/0152444 A1 * | 6/2009 | Otsuka et al. ............. 250/214 A |
| 2010/0141935 A1 * | 6/2010 | Chiba .......................... 356/218 |

FOREIGN PATENT DOCUMENTS

| JP | 2005-337827 A | 12/2005 |
| JP | 2006-332226 A | 12/2006 |
| JP | 2010-074097 A | 4/2010 |

* cited by examiner

*Primary Examiner* — David Porta
*Assistant Examiner* — Casey Bryant
(74) *Attorney, Agent, or Firm* — Taft Stettinius & Hollister LLP

(57) ABSTRACT

There is provided a visible-region light measuring instrument including: a first photodiode and a second photodiode. At least one of the first photodiode and the second photodiode comprises plural photodiodes, when the first photodiode comprises a first plural photodiodes, the visible-region light measuring instrument has first fuses that control connections between the first plural photodiodes and at least one of the first node and the first power supply node. When the second photodiode comprises a second plural photodiodes, the visible-region light measuring instrument has second fuses that control connections between the second plural photodiodes and at least one of the first node and the second power supply node.

15 Claims, 12 Drawing Sheets

VISIBLE-REGION LIGHT MEASURING INSTRUMENT AND VISIBLE-REGION LIGHT MEASURING INSTRUMENT MANUFACTURING METHOD

CROSS-REFERENCE TO RELATED APPLICATIONS

This application is based on and claims priority under 35 U.S.C. §119 from Japanese Patent Application No. 2008-243078 filed Sep. 22, 2008, the disclosure of which is incorporated by reference herein.

RELATED ART

1. Field of the Invention

The present disclosure pertains to a visible-region light measuring instrument and a visible-region light measuring instrument manufacturing method and particularly relates to a visible-region light measuring instrument for lowering the sensitivity in the infrared region that a photodiode inherently has and measuring visible-region light and to a method of manufacturing this visible-region light measuring instrument.

2. Brief Discussion of Related Art

Conventionally, disposing an optical filter that blocks infrared light on a light incident surface when matching the spectral sensitivity of a photodiode to the visual sensitivity of humans has been performed (Japanese Patent Application Laid-Open Publication (JP-A) No. 2005-337827).

Further, disposing an optical filter that blocks visible-region light with which one of two photodiodes is irradiated and transmits only infrared light and subtracting output currents from the two photodiodes to lower the sensitivities in the infrared region of the photodiodes has been performed (JP-A No. 2006-332226).

However, in the spectral sensitivity adjustment method described in JP-A No. 2005-337827, there are the problems that chip costs rise because the filter is expensive and fluctuations in the output voltages resulting from variations in threshold voltage caused by variations in the manufacturing process of transistors cannot be prevented.

Further, in the spectral sensitivity adjustment method described in JP-A No. 2006-332226, there is the problem that adjusting the spectral sensitivity by the difference between the current values of the photodiodes amounts to nothing more than adjusting the currents to be obtained and cannot control variations in the manufacturing process of the spectral sensitivities of the photodiodes.

INTRODUCTION TO THE INVENTION

The present disclosure has been made in order to address the above-described problems, and it is an object thereof to provide a visible-region light measuring instrument and a visible-region light measuring instrument manufacturing method that can control variations in the manufacturing process of the spectral sensitivity of a photodiode.

A first aspect of the present disclosure provides a visible-region light measuring instrument including:

a first photodiode that is electrically connected between a first node and a first power supply node and has spectral sensitivity in the infrared region; and a second photodiode that is electrically connected between the first node and a second power supply node and whose spectral sensitivity in the visible region is greater than its spectral sensitivity in the infrared region, wherein at least one of the first photodiode and the second photodiode comprises a plurality of photodiodes, when the first photodiode comprises a first plurality of photodiodes, the visible-region light measuring instrument has first fuses that control connections between the first plurality of photodiodes and at least one of the first node and the first power supply node, and when the second photodiode comprises a second plurality of photodiodes, the visible-region light measuring instrument has second fuses that control connections between the second plurality of photodiodes and at least one of the first node and the second power supply node.

A second aspect of the present disclosure provides the visible-region light measuring instrument according to the first aspect, wherein when the first photodiode comprises a first plurality of photodiodes and the second photodiode comprises one photodiode, anodes of the first plurality of photodiodes are connected to the first node, a cathode of the second photodiode is connected to the first node and an anode of the second photodiode is connected to the second, power supply node, and one end of each of the first fuses is connected to cathodes of the first photodiodes and the other end of each of the first fuses is connected to the first power supply node.

A third aspect of the present disclosure provides the visible-region light measuring instrument according to the first aspect, wherein when the first photodiode comprises a plurality of first photodiodes and the second photodiode comprises one photodiode, cathodes of the first plurality of photodiodes are connected to the first power supply node, a cathode of the second photodiode is connected to the first node and an anode of the second photodiode is connected to the second power supply node, and one end of each of the first fuses is connected to anodes of the first plurality of photodiodes and the other end of each of the first fuses is connected to the first node.

In the plurality of first photodiodes and the one second photodiode of the second and third aspects of the disclosure, photocurrents corresponding to the amount of light received are generated when the photodiodes are irradiated with light. Subtraction between the value of the photocurrent flowing through the one second photodiode and the sum of the values of the photocurrents flowing through the plurality of first photodiodes is performed, whereby spectral sensitivity in the infrared region is removed and visible-region light can be measured.

Further, by cutting an arbitrary first fuse, the photocurrent value generated from the first photodiode connected to the first fuse that has been cut can be lowered or a situation where the photocurrent generated from the first photodiode connected to the first fuse that has been cut flows to the second photodiode can be controlled, fluctuations in the outputs caused by variations in the manufacturing process of the spectral sensitivities of the first photodiodes and the second photodiode can be controlled, and spectral sensitivity matching the visual sensitivity of humans can be obtained.

A fourth aspect of the present disclosure provides the visible-region light measuring instrument according to the first aspect, wherein when the first photodiode comprises a first plurality of photodiodes and the second photodiode comprises one photodiode, a cathode of the second photodiode is connected to the first node and an anode of the second photodiode is connected to the second power supply node, and one end of each of the first fuses is connected to cathodes of the first plurality of photodiodes and the other end of each of the first fuses is connected to the first power supply node, and the one end of each is connected to anodes of the first plurality of photodiodes and the other end of each is connected to the first node.

In the visual-region light measuring instrument pertaining to the fourth aspect of the disclosure, by cutting an arbitrary first fuse, a situation where the photocurrent generated from the first photodiode connected to the first fuse that has been cut flows to the second photodiode can be controlled, the power supply consumption current can be controlled, and similar to the first and second aspects, fluctuations in the outputs caused by variations in the manufacturing process of the spectral sensitivities of the first photodiodes and the second photodiode can be controlled, and spectral sensitivity matching the visual sensitivity of humans can be obtained.

A fifth aspect of the present disclosure provides the visible-region light measuring instrument according to the first aspect, wherein when the first photodiode comprises one photodiode and the second photodiode comprises a second plurality of photodiodes, an anode of the first photodiode is connected to the first node and a cathode of the first photodiode is connected to the first power supply node, anodes of the second plurality of photodiodes are connected to the second power supply node, and one end of each of the second fuses is connected to cathodes of the second plurality of photodiodes and other end of each of the second fuses is connected to the first node.

A sixth aspect of the present disclosure provides the visible-region light measuring instrument according to the first aspect, wherein when the first photodiode comprises one photodiode and the second photodiode comprises a second plurality of photodiodes, an anode of the first photodiode is connected to the first node and a cathode of the first photodiode is connected to the first power supply node, cathodes of the second plurality of photodiodes are connected to the first node, and one end of each of the second fuses is connected to anodes of the second plurality of photodiodes and the other end of each of the second fuses is connected to the second power supply node.

In the one first photodiode and the plurality of second photodiodes of the fifth and sixth aspects of the disclosure, photocurrents corresponding to the amount of light received are generated when the photodiodes are irradiated with light. Subtraction between the sum of the values of the photocurrents flowing through the plurality of second photodiodes and the value of the photocurrent flowing through the one first photodiode is performed, whereby spectral sensitivity in the infrared region is removed and visible-region light can be measured.

Further, by cutting an arbitrary second fuse, the photocurrent value generated from the second photodiode connected to the second fuse that has been cut can be lowered or a situation where the photocurrent generated from the second photodiode connected to the second fuse that has been cut flows to the second power supply node can be controlled, fluctuations in the outputs caused by variations in the manufacturing process of the spectral sensitivities of the first photodiode and the second photodiodes can be controlled, and spectral sensitivity matching the visual sensitivity of humans can be obtained.

A seventh aspect of the present disclosure provides the visible-region light measuring instrument according to the first aspect, wherein when the first photodiode comprises one photodiode and the second photodiode comprises a second plurality of photodiodes, an anode of the first photodiode is connected to the first node and a cathode of the first photodiode is connected to the first power supply node, and one end of each of the second fuses is connected to cathodes of the second photodiodes and the other end of each of the second fuses is connected to the first node, and the one end of each is connected to anodes of the second plurality of photodiodes and the other end of each is connected to the second power supply node.

In the visual-region light measuring instrument pertaining to the seventh aspect of the disclosure, by cutting an arbitrary second fuse, a situation where the photocurrent generated from the second photodiode connected to the second fuse that has been cut flows to the second power supply node can be controlled, the power supply consumption current can be controlled, and similar to the fifth and sixth aspects, fluctuations in the outputs caused by variations in the manufacturing process of the spectral sensitivities of the first photodiode and the second photodiodes can be controlled, and spectral sensitivity matching the visual sensitivity of humans can be obtained.

An eighth aspect of the present disclosure provides the visible-region light measuring instrument according to the first aspect, wherein when the first photodiode and the second photodiode each comprises a first and a second plurality of photodiodes, anodes of the first plurality of photodiodes are connected to the first node, one end of each of the first fuses is connected to cathodes of the first plurality of photodiodes and the other end of each of the first fuses is connected to the first power supply node, and one end of each of the second fuses is connected to cathodes of the second plurality of photodiodes and the other end of each of the second fuses is connected to the first node, and the one end of each is connected to anodes of the second plurality of photodiodes and the other end of each is connected to the second power supply node.

A ninth aspect of the present disclosure provides the visible-region light measuring instrument according to the first aspect, wherein when the first photodiode and the second photodiode are each configured by a first and a second plurality of photodiodes, cathodes of the first plurality of photodiodes are connected to the first power supply node, one end of each of the first fuses is connected to anodes of the first plurality of photodiodes and the other end of each of the first fuses is connected to the first node, and one end of each of the second fuses is connected to cathodes of the second plurality of photodiodes and the other end of each of the second fuses is connected to the first node, and the one end of each is connected to anodes of the second plurality of photodiodes and the other end of each is connected to the second power supply node.

A tenth aspect of the present disclosure provides the visible-region light measuring instrument according to the first aspect, wherein when the first photodiode and the second photodiode each comprises a first and a second plurality of photodiodes, one end of each of the first fuses is connected to cathodes of the first plurality of photodiodes and the other end of each of the first fuses is connected to the first power supply node, and the one end of each is connected to anodes of the first plurality of photodiodes and the other end of each is connected to the first node, and one end of each of the second fuses is connected to cathodes of the second plurality of photodiodes and the other end of each of the second fuses is connected to the first node, and the one end of each is connected to anodes of the second plurality of photodiodes and the other end of each is connected to the second power supply node.

An eleventh aspect of the present disclosure provides the visible-region light measuring instrument according to the first aspect, further including a logic circuit that amplifies currents generated from the first plurality of photodiodes and the second plurality of photodiodes, wherein the first fuses are connected to the first plurality of photodiodes, the second fuses are connected to the second plurality of photodiodes, and the first fuses and the second fuses are disposed between the first plurality of photodiodes and the second plurality of photodiodes and the logic circuit.

A twelfth aspect of the present disclosure provides the visible-region light measuring instrument according to the eleventh aspect, further including a light-blocking metal that is disposed so as to cover the logic circuit, the first fuses and the second fuses and blocks light with which the visible-region light measuring instrument is irradiated from the outside.

In the visible-region light measuring instrument pertaining to the eleventh and twelfth aspects of the disclosure, the first fuses, the second fuses and the logic circuit are covered by the light-blocking metal, so a situation where light from the outside is made incident on the logic circuit and operation of the logic circuit becomes unstable can be prevented.

A thirteenth aspect of the present disclosure provides the visible-region light measuring instrument according to the twelfth aspect, wherein the light-blocking metal has openings in positions corresponding to between the first plurality of photodiodes and the second plurality of photodiodes and the logic circuit, and the first fuses and the second fuses are disposed in positions corresponding to the openings in the light-blocking metal.

In the visible-region light measuring instrument pertaining to the thirteenth aspect of the disclosure, the first fuses and the second fuses are disposed in positions corresponding to the openings in the light-blocking metal, so cutting of the first fuses and the second fuses can be performed easily.

A fourteenth aspect of the present disclosure provides the visible-region light measuring instrument according to claim the thirteenth aspect, further including a contact metal that is disposed in a position corresponding to the light-blocking metal and blocks light from the outside that is made incident diagonally with respect to the openings in the light-blocking metal.

In the visible-region light measuring instrument pertaining to the fourteenth aspect of the disclosure, by disposing the contact metal in a position corresponding to the light-blocking metal, light made incident diagonally with respect to the openings in the light-blocking metal can be blocked, so a situation where operation of the logic circuit becomes unstable can be prevented.

A fifteenth aspect of the present disclosure provides a method of manufacturing a visible-region light measuring instrument, the method including:

manufacturing, as samples, a plurality of the visible-region light measuring instrument of any of the first through fourteenth aspects;

varying a cut number and cutting fuses of each of the plural samples;

measuring output waveforms of the visible-region light measuring instruments whose fuses have been cut; and cutting, in the visible-region light measuring instruments whose fuses have not been cut, the same fuses as the cut places and number in a sample with which an intended output waveform has been obtained to manufacture an intended visible-region light measuring instrument.

According to the eighth to fifteenth aspects of the disclosure, by cutting an arbitrary fuse, the sum of the photocurrent values generated from the first photodiodes and the sum of the photocurrent values generated from the second photodiodes can be adjusted, fluctuations in the outputs caused by variations in the manufacturing process of the spectral sensitivities of the first photodiodes and the second photodiodes can be controlled, spectral sensitivity matching the visual sensitivity of humans can be obtained, and a situation where operation of the logic circuit becomes unstable because of light from the outside can be prevented.

Further, depending on the cut place of the fuse, the power supply consumption current can also be controlled.

As described above, according to the present disclosure, by cutting an arbitrary fuse and adjusting the difference between the sum of the photocurrent values of the second photodiodes and the sum of the photocurrents of the first photodiodes, there are obtained the effects that fluctuations in the outputs caused by variations in the manufacturing process of the second photodiodes and the first photodiodes can be controlled, spectral sensitivity matching the visual sensitivity of humans can be obtained, and a situation where operation of the logic circuit becomes unstable because of light from the outside can be prevented.

BRIEF DESCRIPTION OF THE DRAWINGS

Exemplary embodiments of the present disclosure will be described in detail based on the following figures, wherein.

DETAILED DESCRIPTION

The exemplary embodiments of the present disclosure are described and illustrated below to encompass a visible-region light measuring instrument and a visible-region light measuring instrument manufacturing method and particularly relates to a visible-region light measuring instrument for lowering the sensitivity in the infrared region that a photodiode inherently has and measuring visible-region light and to a method of manufacturing this visible-region light measuring instrument. Of course, it will be apparent to those of ordinary skill in the art that the preferred embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention.

First Exemplary Embodiment

Figure 1:
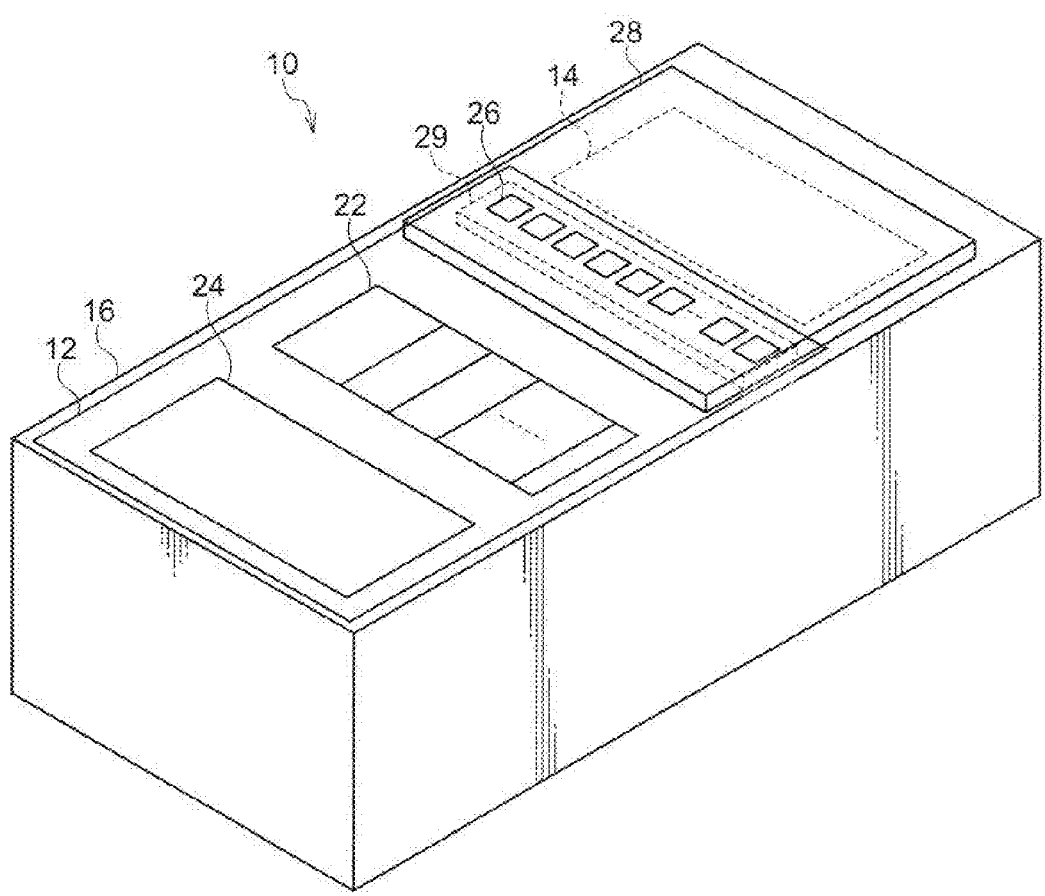
FIG. 1 is a perspective view of a visible-region light measuring instrument pertaining to the present disclosure.
Figure 2:
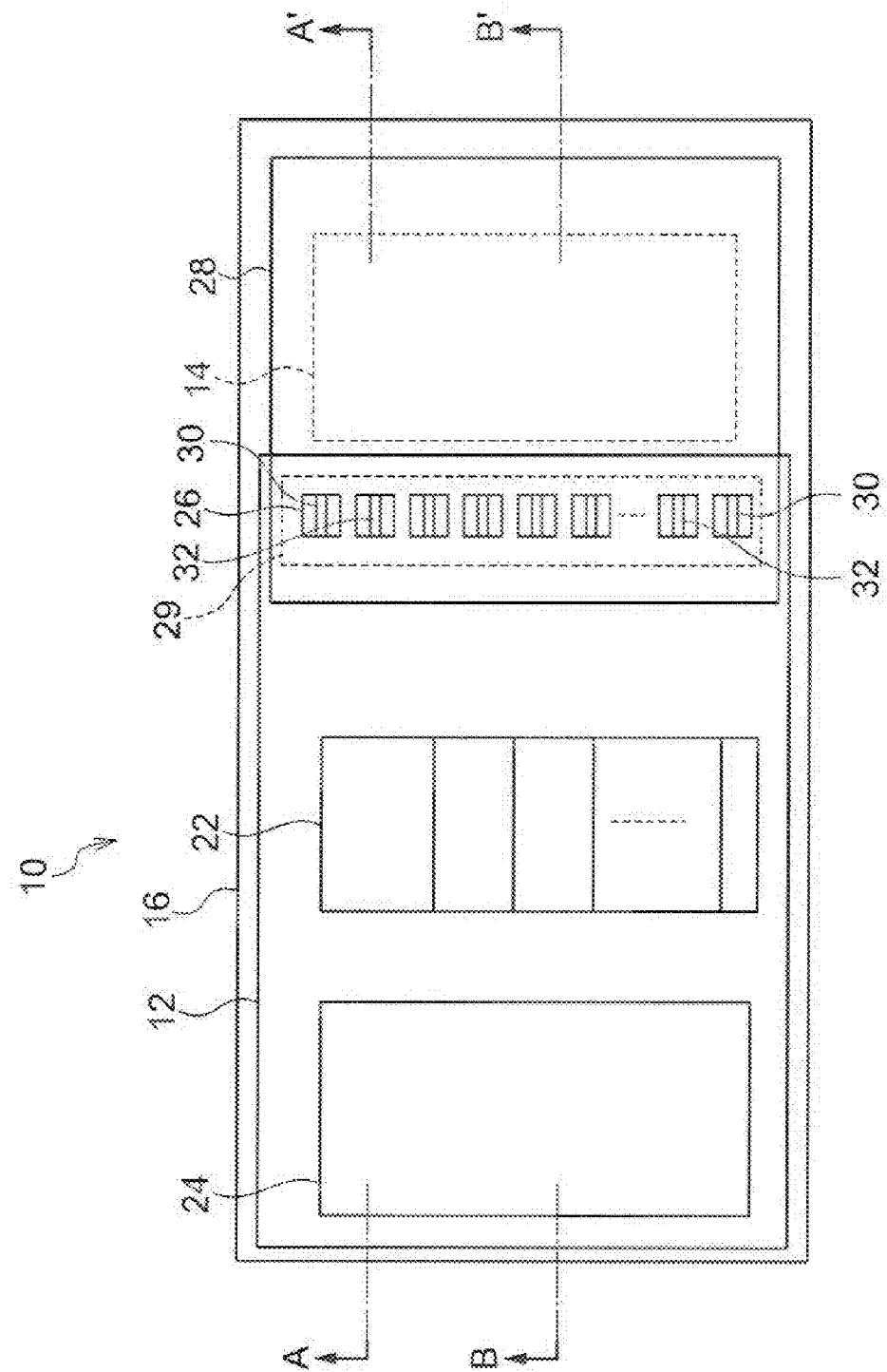
FIG. 2 is a top view of the visible-region light measuring instrument pertaining to the present disclosure.
Figure 3A:
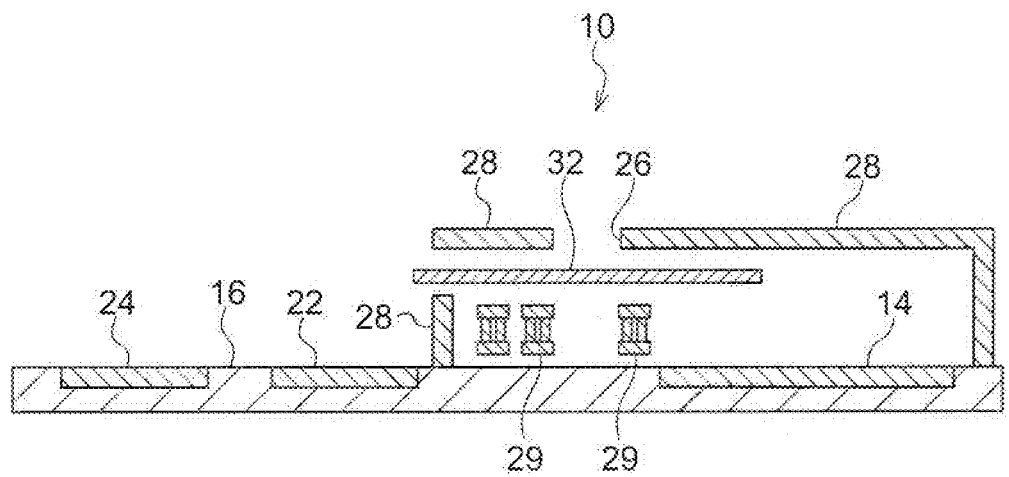
FIG. 3A is an A-A' cross-sectional view of the visible-region light measuring instrument of FIG. 2.
Figure 3B:
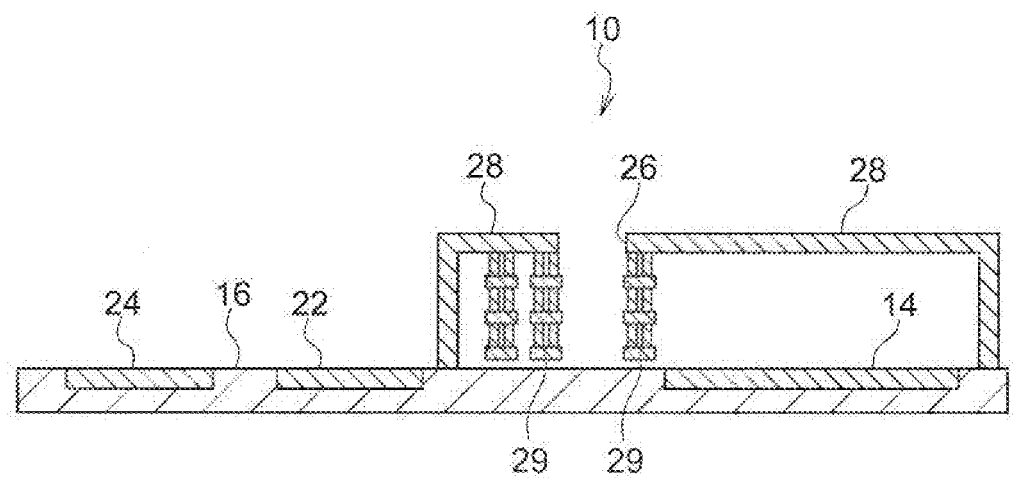
FIG. 3B is a B-B' cross-sectional view of the visible-region light measuring instrument of FIG. 2.

As shown in FIG. 1 to FIG. 3, an illuminance sensor 10 pertaining to a first exemplary embodiment comprises a photodetector circuit 12 and a current amplifier circuit 14 and is formed on a semiconductor substrate 16.

The photodetector circuit 12 includes: n number (where n is a natural number and, for example, can be equal to 3) of infrared photodiodes 22 that have spectral sensitivity characteristics in the visible region and the infrared region, whose spectral sensitivity characteristic in the visible region is greater than their spectral sensitivity characteristic in the infrared region, and which generate photocurrents corresponding to an amount of light received; and one photodiode 24 whose spectral sensitivity characteristic in the visible region is greater than its spectral sensitivity characteristic in the infrared region, whose spectral sensitivity characteristics are better than the spectral sensitivity characteristics of the infrared photodiodes 22, and which generates a photocurrent corresponding to an amount of light received.

Figure 4:
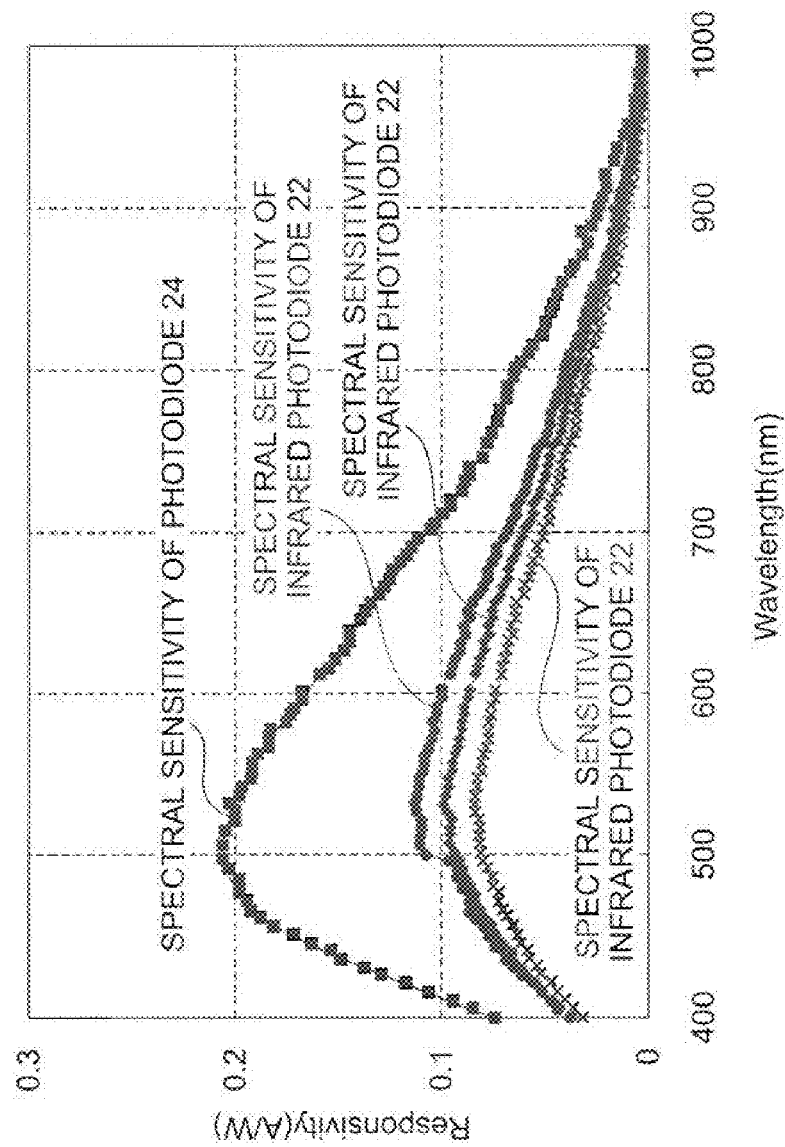
FIG. 4 is a waveform diagram showing spectral sensitivity characteristics of infrared photodiodes 22 and a photodiode 24 pertaining to a first exemplary embodiment.

As shown in FIG. 4, the infrared photodiodes 22 are configured such that their wavelengths when their spectral sensitivities become the highest become, for example, about 2 times higher than the wavelength of the photodiode 24 when its spectral sensitivity becomes the highest. Further, the spectral sensitivities of the infrared photodiodes 22 are configured such that, by making the method of manufacturing PN junctions of the infrared photodiodes 22 the same, the spectral sensitivities have a proportional relationship with the areas of the PN junctions of the infrared photodiodes 22.

The current amplifier circuit 14 is connected to the photodetector circuit 12 and converts the photocurrents outputted from the photodetector circuit 12 to voltage.

A light-blocking metal 28 has 2n number of openings 26 in positions corresponding to between the current amplifier circuit 14 and the infrared photodiodes 22 and is formed so as to cover the current amplifier circuit 14 such that the current amplifier circuit 14 is not irradiated with light.

A contact metal 29 that blocks light made incident diagonally with respect to the openings 26 is formed between the semiconductor substrate 16 and the light-blocking metal 28 and in a position corresponding to the light-blocking metal 28.

N number of first metal fuses 30 and n number of second metal fuses 32, which are disposed one each in positions corresponding to the openings 26 as shown in FIG. 2 and FIG. 3A, are disposed between the light-blocking metal 28 and the contact metal 29 and in positions corresponding to the openings 26.

Figure 5:
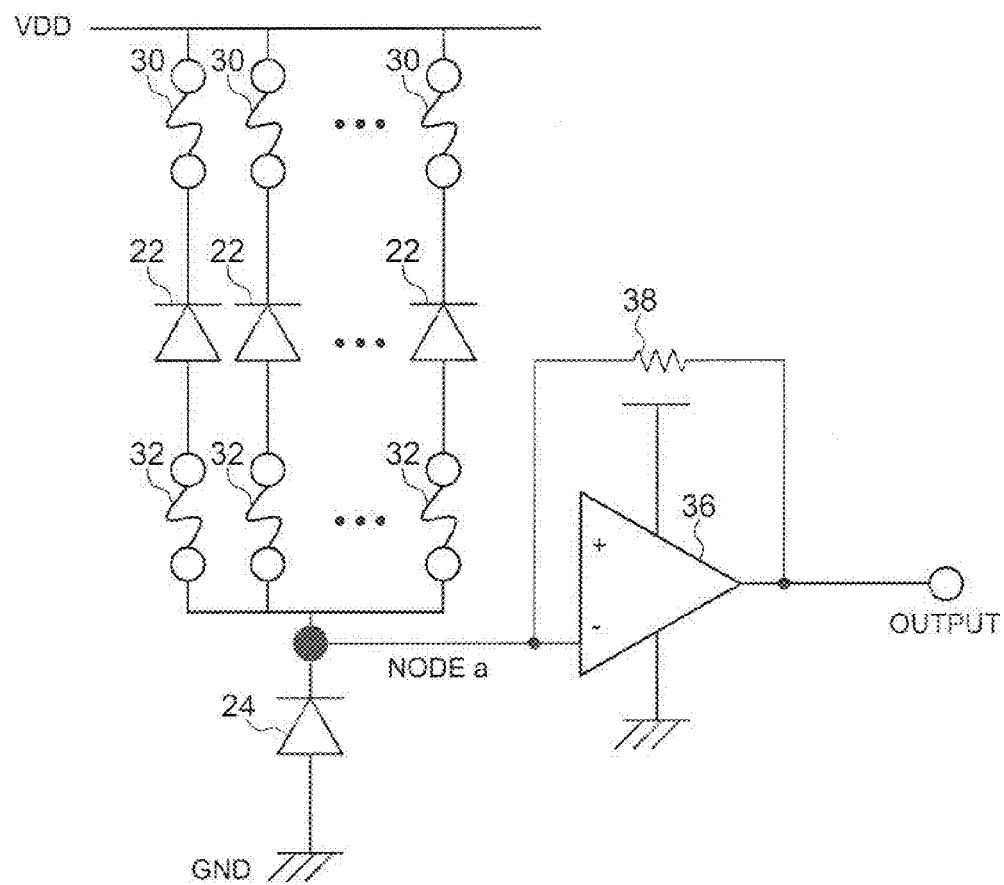
FIG. 5 is a circuit diagram of the visible-region light measuring instrument pertaining to the first exemplary embodiment.

Next, the circuit configuration of the illuminance sensor 10 will be described using FIG. 5.

One end of each of the first metal fuses 30 is connected to cathodes of the n number of infrared photodiodes 22 configured by PN junctions, and one end of each of the second metal fuses 32 is connected to anodes of the n number of infrared photodiodes 22, whereby series circuits are formed, and these series circuits are connected in parallel. Further, an unillustrated positive power supply is reverse-bias connected via a power supply node VDD to the other end of each of the n number of first metal fuses 30, and a node a is connected to the other end of each of the n number of second metal fuses 32.

A cathode of the one photodiode 24 configured by a PN junction is connected to the node a, and an anode of the one photodiode 24 is connected to a ground GND.

In this photodetector circuit 12, by cutting both the first metal fuse 30 and the second metal fuse 32 in an arbitrary series circuit using a laser, the ratio of the total value of the PN junction areas of the infrared photodiodes 22 connected to the first metal fuses 30 and the second metal fuses 32 that have not been cut by the laser with respect to the PN junction area of the photodiode 24—that is, the area coefficient (hereinafter, "total area coefficient m")—can be adjusted.

The current amplifier circuit 14 comprises an op-amp 36 and a resistor 38. An inverting input terminal of the op-amp 36 is connected to the node a, and a non-inverting input terminal of the op-amp 36 is connected to an unillustrated constant voltage power supply such that a constant reference voltage is supplied. One end of the resistor 38 is connected to the inverting input terminal, and the other end of the resistor 38 is connected to an output terminal.

Next, operation of the illuminance sensor 10 of the present exemplary embodiment will be described.

When the n number of infrared photodiodes 22 and the one photodiode 24 are irradiated with light, photocurrents corresponding to the amount of light received are generated.

Assuming that $I_{IR1}$ to $I_{IRn}$ represent the photocurrents generated by the n number of infrared photodiodes 22, $I_{IR}$ represents the sum of $I_{IR1}$ to $I_{IRn}$ and $I_{VIS}$ represents the photocurrent generated by the one photodiode 24, when $I_{VIS} > I_{IR}$, then a current value I between the node a and the input side of the current amplifier circuit 14 becomes $I = I_{VIS} - I_{IR}$ by Kirchhoff's laws. The direction of the current becomes the direction leading out from the current amplifier circuit 14.

The output voltage from the output terminal of the current amplifier circuit 14 approximately becomes $V_O = -R \times I$ assuming that $V_O$ represents the output voltage and R represents the resistance of the resistor 38.

Next, a method of manufacturing an illuminance sensor having an intended spectral sensitivity characteristic in the present exemplary embodiment will be described.

First, numerous sensors are manufactured in the same lot, plural (maximum $_nC_1 + _nC_2 + \ldots _nC_{n-1}$ number) sensors are removed as samples from among the numerous sensors that have been manufactured, the first metal fuse 30 and the second metal fuse 32 in an arbitrary series circuit are cut to place the series circuit in a non-conductive state, and plural types of sensors having different numbers of non-conductive state series circuits and whose total area coefficients m differ are prepared.

Figure 6:
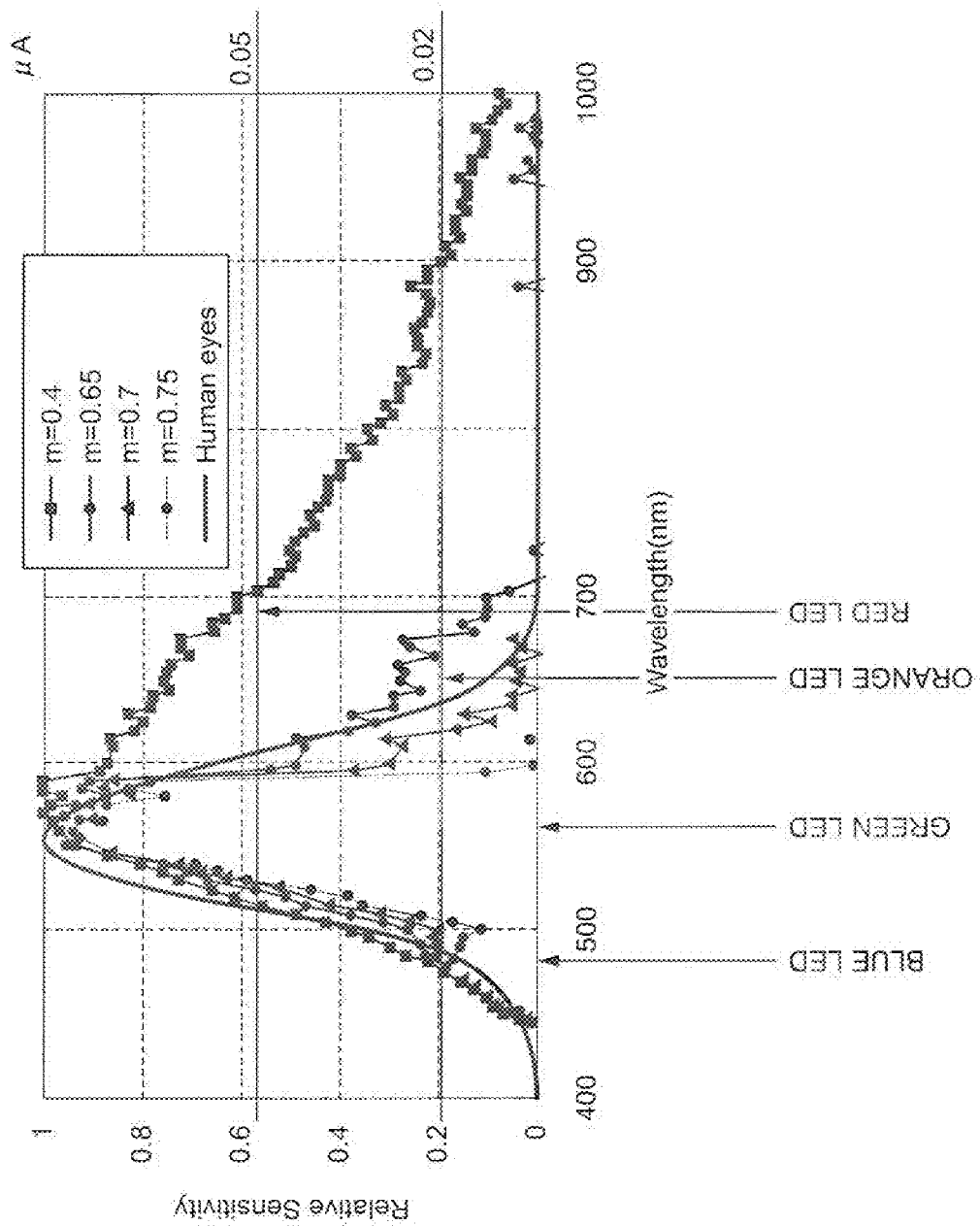
FIG. 6 is a waveform diagram showing the visual sensitivity characteristic of a human and relative values when 1 is the highest value of a photocurrent value when an arbitrary metal fuse of the visible-region light measuring instrument pertaining to the first exemplary embodiment is cut.

Then, as shown in FIG. 6, all of the plural types of sensors whose fuses have been cut are irradiated with light, the photocurrent values that are outputted are measured, and the relative values of the photocurrent values when the highest value of the photocurrent values that have been measured is used as a reference value (e.g., 1) are determined in regard to the plural types of sensors.

Next, one sensor that has a relative value that is closest to the visual sensitivity characteristic of humans is selected on the basis of these relative values, and the first metal fuses 30 and the second metal fuses 32 are cut such that the total area coefficients m of the sensors that were not removed as samples among the numbers sensors that were manufactured in the same lot become the same as that of the sensor that has the relative value that is closest to the visual sensitivity characteristic of humans.

Next, a case where three of the infrared photodiodes 22 are used in the present exemplary embodiment will be taken as an example and specifically described.

Figure 7:
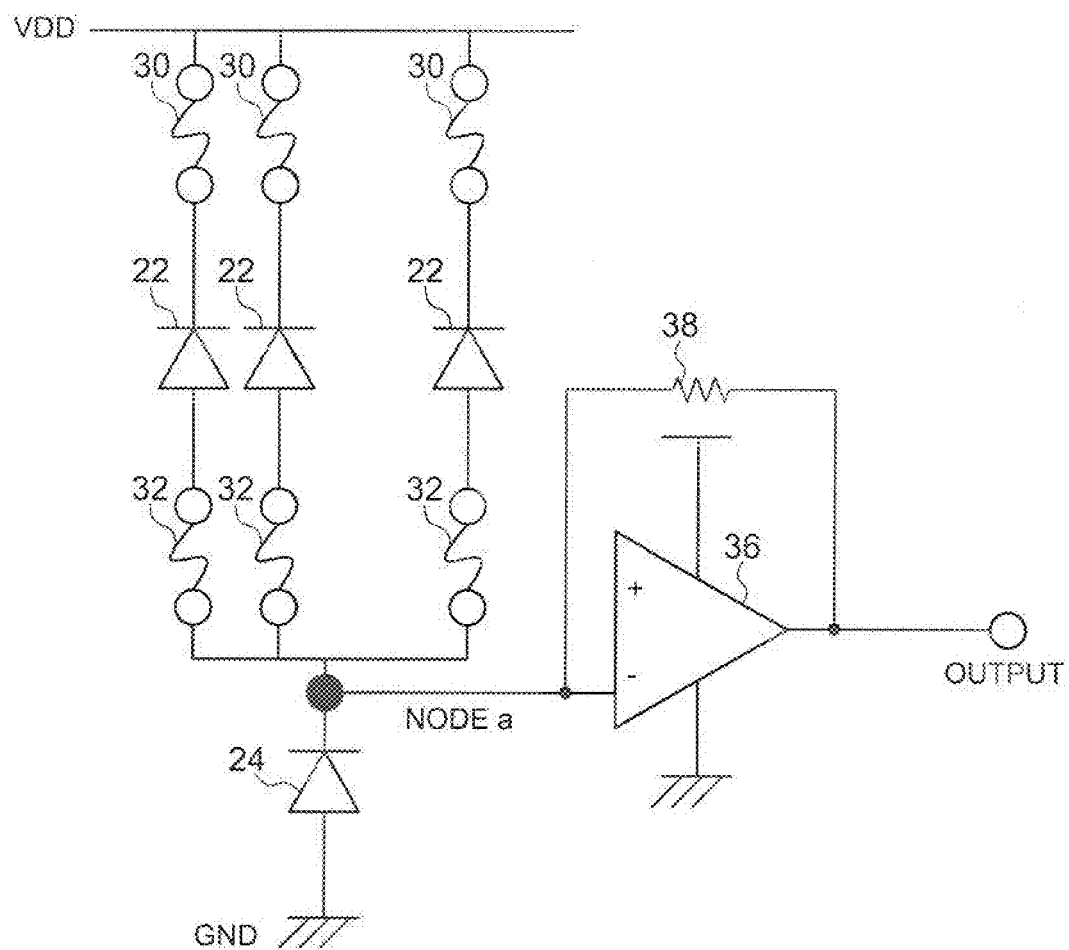
FIG. 7 is a circuit diagram when three of the infrared photodiodes 22 are used in the visible-region light measuring instrument pertaining to the first exemplary embodiment.

As shown in FIG. 7, three of the infrared photodiodes 22 are used in the illuminance sensor 10. The infrared photodiodes 22 are laid out such that their area coefficients become 0.4, 0.35 and 0.3. The cathodes of the infrared photodiodes 22 are connected to the first metal fuses 30, and the anodes of the infrared photodiodes 22 are connected to the second metal fuses 32.

Next, a method of manufacturing an illuminance sensor having an intended spectral sensitivity characteristic will be described using the illuminance sensor of FIG. 7.

First, numerous sensors are manufactured in the same lot, six ($_3C_1 + _3C_2$) sensors are removed as samples from among the numerous sensors that have been manufactured, and when virtually no photocurrents are outputted even when the sensors are irradiated with light from blue and green LEDs in the visible region in a state where the first metal fuses 30 and the second metal fuses 32 have not been cut (e.g., when total area coefficient m=1.05), cutting of one pair of the first metal fuses 30 and the second metal fuses 32 is performed as described next in order to raise the photocurrent values that are outputted.

As the samples, six sensors (six comprising three types of sensors where one pair of fuses has been cut and three types of sensors where two pairs of fuses have been cut) whose first metal fuses 30 and whose second metal fuses 32 have been cut such that their total area coefficients m become 0.3, 0.35, 0.4, 0.65, 0.7 and 0.75, for example, are prepared, and the sensors are irradiated with light.

First, in a case where the sensor whose total area coefficient m=0.4 is irradiated with light, when the sensor is irradiated with light from a red LED and the obtained photocurrent value is equal to or greater than a rated value, a sensor whose total area coefficient m is greater than 0.4 is selected in order to lower the photocurrent value. Here, the sensor whose total area coefficient m=0.65 is selected.

Next, when the sensor is irradiated with light from an orange LED and the obtained photocurrent value is equal to or greater than the rated value, a sensor whose total area coefficient m is greater than 0.65 is selected in order to lower the photocurrent value. Here, the sensor whose total area coefficient m=0.7 is selected.

Then, when the sensor is irradiated with light from the orange LED and the photocurrent value is equal to or greater than the rated value, the sensor whose total area coefficient m=0.75 is selected.

Further, in a case where the photocurrent value is lower than the rated value, when the sensor is irradiated with light from the red LED and the photocurrent value is lower than the rated value, the sensor whose total area coefficient m=0.7 is selected.

It will be noted that the blue and green LEDs are also similarly used in order to verify whether the photocurrents that the sensors generate by light irradiation amount are lower than the rated value.

As described above, in the illuminance sensor pertaining to the present exemplary embodiment, one arbitrary pair of the first fuses and the second fuses is cut to adjust the photocurrent value that is outputted such that it becomes lower than the rated value, so the power supply consumption current is controlled, variations in spectral sensitivity resulting from variations in the manufacturing process of the infrared photodiodes and the photodiode can be controlled, and a spectral sensitivity characteristic close to the visual sensitivity characteristic of humans can be obtained.

Figure 8:
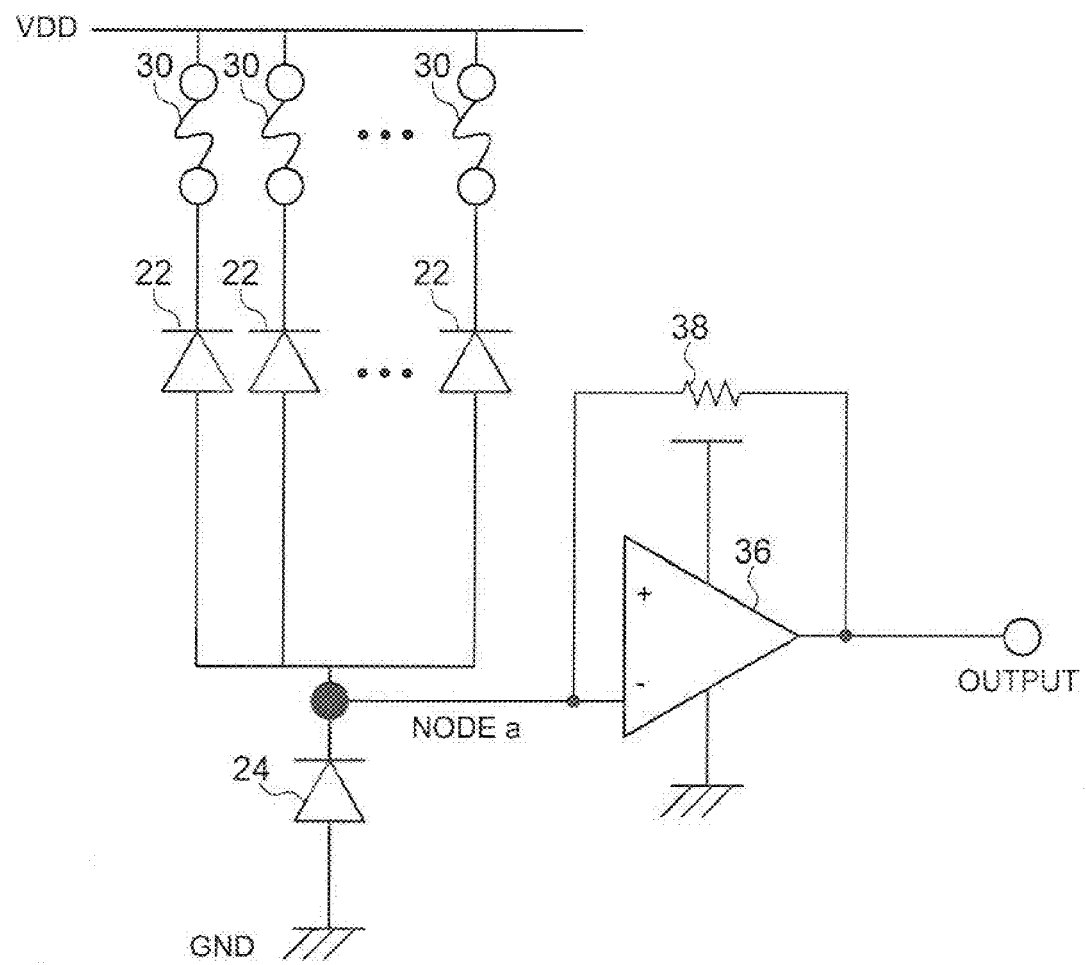
FIG. 8 is a diagram showing a modification of the visible-region light measuring instrument pertaining to the first exemplary embodiment.

It will be noted that, in the present exemplary embodiment, a case has been described where the first metal fuses are connected to the cathodes of the infrared photodiodes and the second metal fuses are connected to the anodes of the infrared photodiodes, but the second metal fuses 32 may be omitted such that, as shown in FIG. 8, the first metal fuses 30 are connected to the cathodes of the infrared photodiodes 22 and the cathode of the photodiode 24 is connected to the anodes of the infrared photodiodes 22.

Further, the first metal fuses 30 may be omitted such that the cathodes of the infrared photodiodes 22 are connected to the power supply node VDD.

Second Exemplary Embodiment

Next, a second exemplary embodiment will be described. It will be noted that the same reference numerals will be given to portions corresponding to those in the first exemplary embodiment and that description of those corresponding portions will be omitted.

Figure 9:
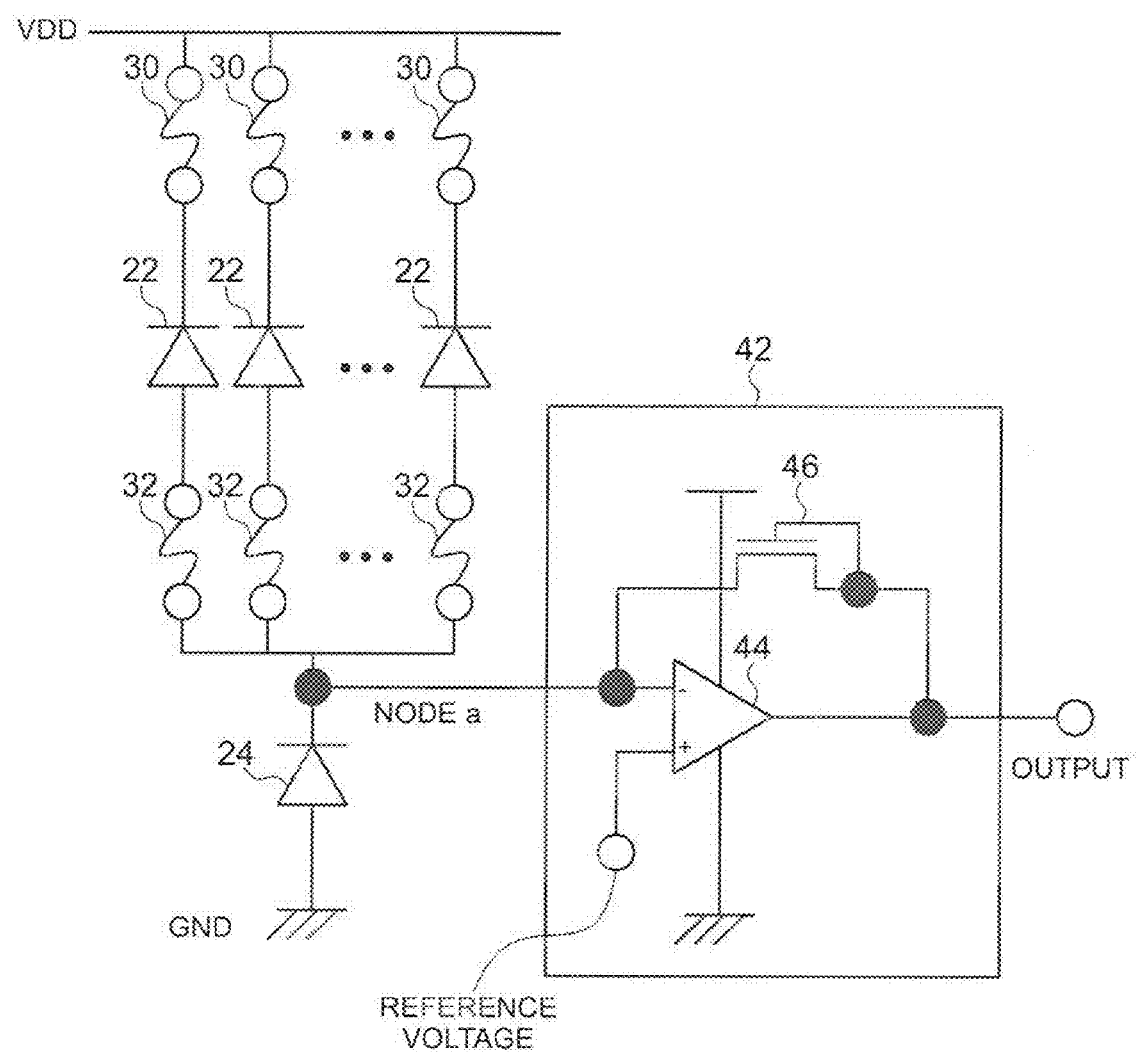
FIG. 9 is a circuit diagram of a visible-region light measuring instrument pertaining to a second exemplary embodiment.

As shown FIG. 9, in the illuminance sensor 10 pertaining to the second exemplary embodiment, a logarithmic converter circuit 42 is used instead of the current amplifier circuit 14 of the first exemplary embodiment.

The logarithmic converter circuit 42 comprises an op-amp 44 and an NMOS transistor 46. An inverting input terminal of the op-amp 44 is connected to the node a, and a non-inverting input terminal of the op-amp 44 is connected to an unillustrated constant voltage power supply such that a constant reference voltage is supplied.

A gate and a drain of the NMOS transistor 46 are connected to an output terminal. The NMOS transistor 46 functions as a diode with mutually the same characteristics as a result of the gate and the drain short-circuiting. A source of the NMOS transistor 46 is connected to the inverting input terminal of the op-amp 44.

Next, operation of the illuminance sensor 10 pertaining to the second exemplary embodiment will be described.

When $I_{VIS} > I_{IR}$, then the current value I between the node a and the input side of the logarithmic converter circuit 42 becomes I=$I_{VIS}$−$I_{IR}$, and the direction of the current becomes the direction leading out from the logarithmic converter circuit 42.

The output voltage from the output terminal of the logarithmic converter circuit 42 becomes approximately $V_O$=kT/q×ln(I/$I_s$) assuming that $V_O$ represents the output voltage, $I_s$ represents inverse voltage saturation current, q represents electric charge amount, k represents Boltzmann's constant and T represents absolute temperature.

A method of manufacturing an illuminance sensor having an intended spectral sensitivity characteristic is the same as that in the first exemplary embodiment, so description thereof will be omitted.

In the illuminance sensor pertaining to the present exemplary embodiment, one arbitrary pair of the first fuses and the second fuses is cut to adjust the photocurrent value that is outputted such that it becomes lower than the rated value, so the power supply consumption current is controlled, variations in spectral sensitivity resulting from variations in the manufacturing process of the infrared photodiodes and the photodiode can be controlled, and a spectral sensitivity characteristic close to the visual sensitivity characteristic of humans can be obtained.

It will be noted that, similar to what was described in the first exemplary embodiment, just one of either the first metal fuses 30 or the second metal fuses may be connected to the infrared photodiodes 22.

Third Exemplary Embodiment

Next, a third exemplary embodiment will be described. It will be noted that the same reference numerals will be given to portions corresponding to those in the first exemplary embodiment and that description of those corresponding portions will be omitted.

Figure 10:
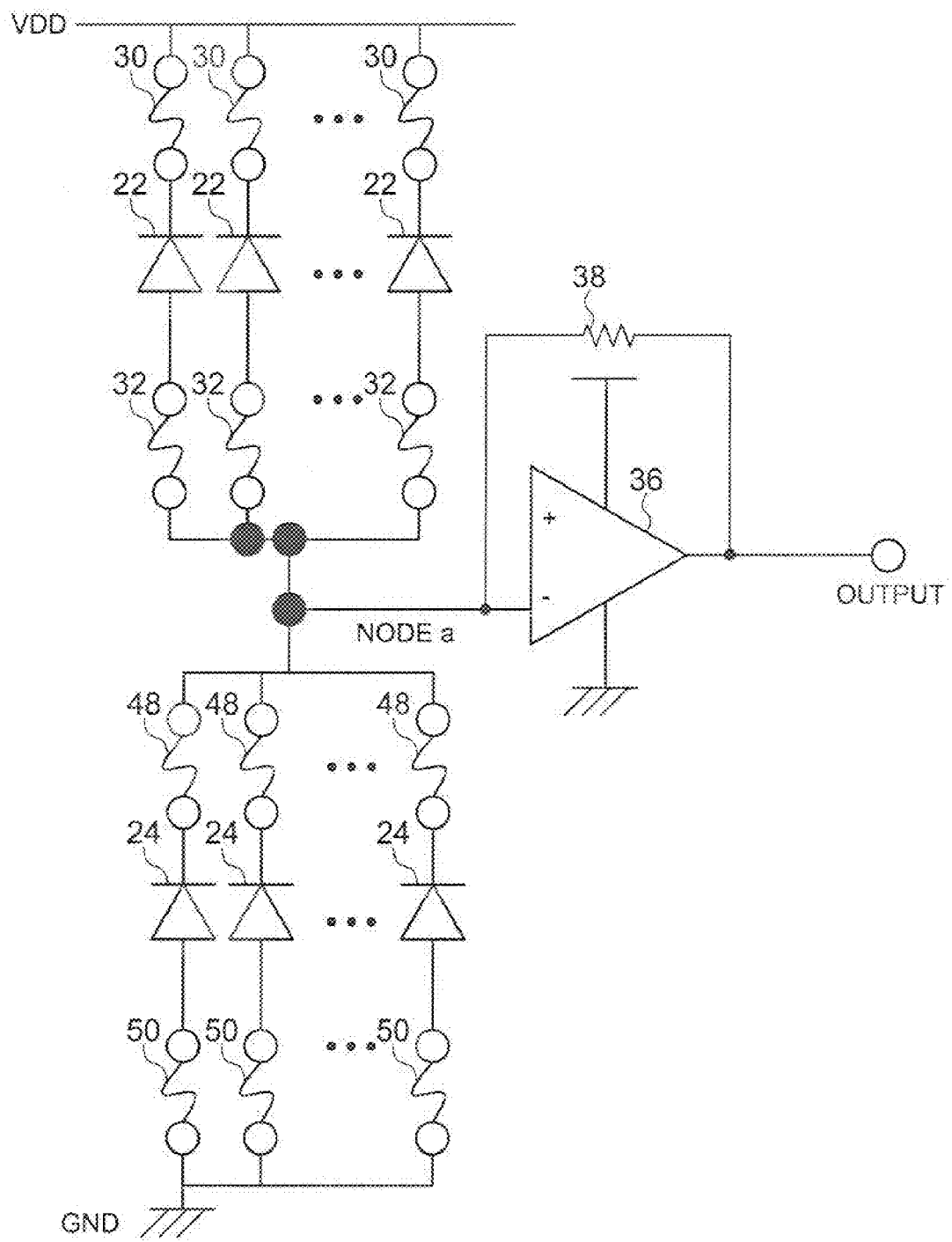
FIG. 10 is a circuit diagram of a visible-region light measuring instrument pertaining to a third exemplary embodiment.

As shown in FIG. 10, in the illuminance sensor 10 pertaining to the third exemplary embodiment, n number of the photodiodes 24 of the first exemplary embodiment are used.

One end of each of third metal fuses 48 is connected is cathodes of the n number of photodiodes 24, and one end of each of fourth metal fuses 50 is connected to anodes of the n number of photodiodes 24, whereby series circuits are configured, and these series circuits are connected in parallel. Further, the other end of each of the n number of third metal fuses 48 is connected to the node a, and the other end of each of the n number of fourth metal fuses 50 is connected to the pound GND.

Further, in the photodetector circuit 12, the total area coefficient m can be adjusted by cutting arbitrary first metal fuses 30, second metal fuses 32, third metal fuses 48 and fourth metal fuses 50 using a laser.

Next, a method of manufacturing an illuminance sensor having an intended spectral sensitivity characteristic in the third exemplary embodiment will be described.

First, numerous sensors are manufactured in the same lot, plural (maximum $({}_nC_1+{}_nC_2+\ldots{}_nC_{n-1})^2$ number) sensors are removed as samples from among the numerous sensors that have been manufactured, an arbitrary pair of the first metal fuses 30 and the second metal fuses 32 and a pair of the third metal fuses 48 and the fourth metal fuses 50 are cut to place intended series circuits in a non-conductive state, and plural types of sensors having different numbers of non-conductive state series circuits and whose total area coefficients m differ are prepared.

Then, all of the plural types of sensors are irradiated with light, the photocurrent values that are outputted are measured, and the relative values of the photocurrent values when the highest value of the photocurrent values that have been measured is used as a reference value (e.g., 1) are determined in regard to the plural types of sensors.

Next, a sensor that has a relative value that is closest to the visual sensitivity characteristic of humans is selected, and one pair of the first metal fuses 30 and the second metal fuses 32 and one pair of the third metal fuses 48 and the fourth metal fuses 50 are cut such that the total area coefficients m of the sensors that were not removed as samples among the numerous sensors that were manufactured in the same lot become the same as that of the sensor that has the relative value that is closest to the visual sensitivity characteristic of humans.

Next, a case where three each of the infrared photodiodes 22 and the photodiodes 24 are used in the present exemplary embodiment will be taken as an example and specifically described.

Figure 11:
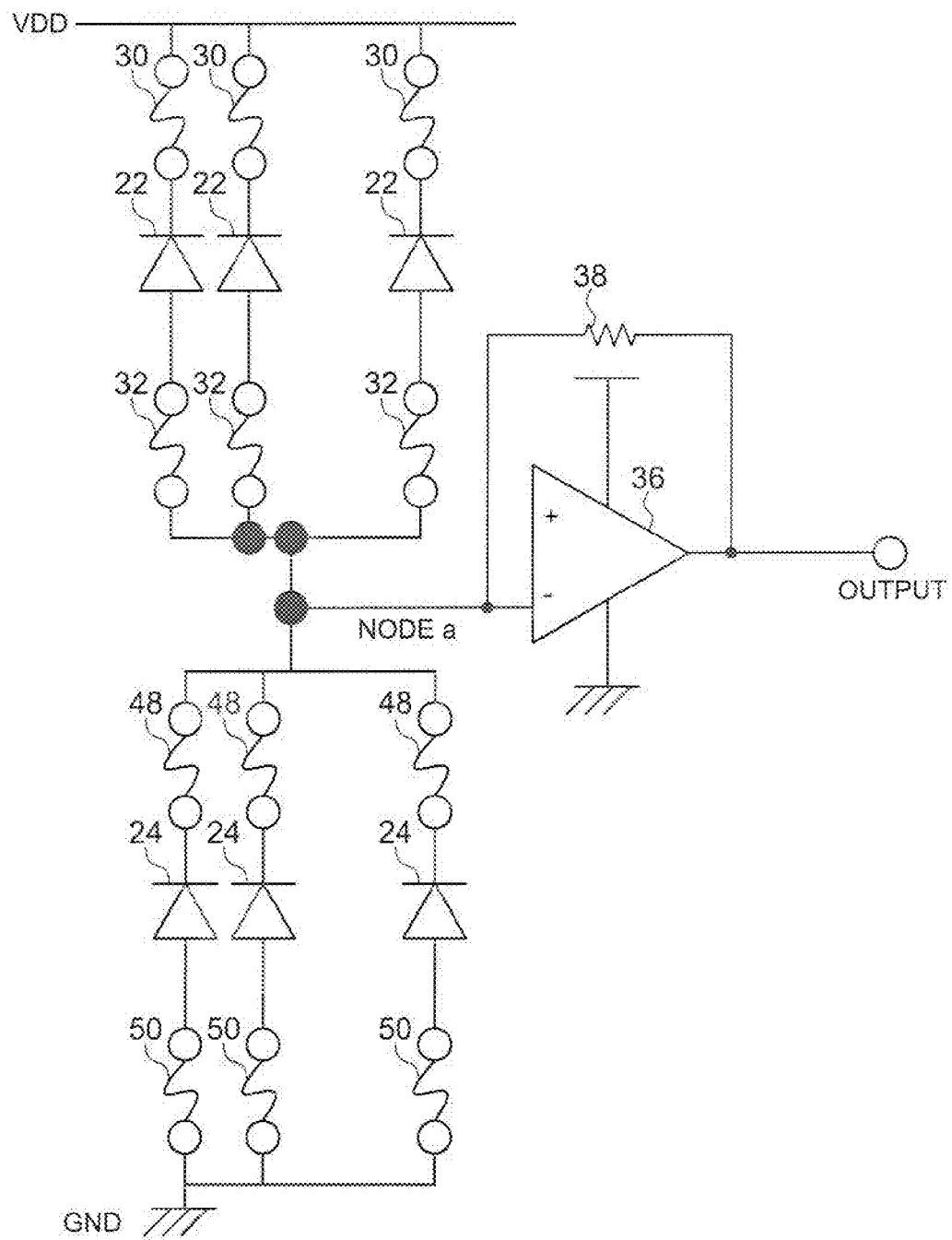
FIG. 11 is a circuit diagram when three each of the infrared photodiodes 22 and the photodiodes 24 are used in the visible-region light measuring instrument pertaining to the third exemplary embodiment.

As shown in FIG. 11, in the illuminance sensor 10, three each of the infrared photodiodes 22 and the photodiodes 24 are used. The infrared photodiodes 22 and the photodiodes 24 are laid out such that their area coefficients become 0.4, 0.35 and 0.3. The cathodes of the infrared photodiodes 22 are connected to the first metal fuses 30, and the anodes of the infrared photodiodes 22 are connected to the second metal fuses 32. The cathodes of the photodiodes 24 are connected to the third metal fuses 48, and the anodes of the photodiodes 24 are connected to the fourth metal fuses 50.

Next, a method of manufacturing an illuminance sensor having an intended spectral sensitivity characteristic will be described.

First, numerous sensors are manufactured in the same lot, 36 (($_3C_1+_3C_2)^2$) sensors are removed as samples from among the numerous sensors that have been manufactured, and when virtually no photocurrents are outputted even when the sensors are irradiated with light from the blue and green LEDs in the visible region in a state where one pair of the first metal fuses 30 and the second metal fuses 32 and one pair of the third metal fuses 48 and the fourth metal fuses 50 have not been cut (e.g., when total area coefficient m=1.05), cutting of the first metal fuses 30 and the second metal fuses 32 is performed in order to raise the photocurrent values that are outputted.

As the samples, six sensors (six comprising three types of sensors where one pair of fuses has been cut and three types of sensors where two pairs of fuses have been cut) whose first metal fuses 30 and whose second metal fuses 32 have been cut such that their total area coefficients m become 0.3, 0.35, 0.4, 0.65, 0.7 and 0.75, for example, are prepared, and the sensors are irradiated with light.

First, when the sensor whose total area coefficient m equals 0.4 is irradiated with light from the red LED and the obtained photocurrent value is equal to or greater than the rated value, a sensor whose total area coefficient m is greater than 0.4 is selected in order to lower the photocurrent value. Here, the sensor whose total area coefficient m=0.65 is selected.

Further, the total area coefficient m may also be adjusted such that it becomes greater than 0.4 by cutting one pair of the third metal fuses 48 and the fourth metal fuses 50 of the sensor whose total area coefficient m=0.4.

Next, when the sensor is irradiated with light from the orange LED and the obtained photocurrent value is equal to or greater than the rated value, a sensor whose total area coefficient in is greater than 0.65 is selected in order to lower the photocurrent value. Here, the sensor whose total area coefficient m=0.7 is selected.

It will be noted that the total area coefficient m may also be adjusted such that it becomes greater than 0.65 by cutting one pair of the third metal fuses 48 and the fourth metal fuses 50 of the sensor whose total area coefficient m=0.65.

Then, when the sensor is irradiated with light from the orange LED and the photocurrent value is equal to or greater than the rated value, the sensor whose total area coefficient m=0.75 is selected, or the total area coefficient m is adjusted such that it becomes equal to 0.75 by cutting the third metal fuses 48 and the fourth metal fuses 50 of the sensor whose total area coefficient m=0.7.

Further, in a case where the photocurrent value is lower than the rated value, when the sensor is irradiated with light from the red LED and the photocurrent value is lower than the rated value, the sensor whose total area coefficient in equals 0.7 is selected.

It will be noted that the blue and green LEDs are also similarly used in order to verify whether the photocurrents that the sensors generate by light irradiation amount are lower than the rated value.

As described above, in the illuminance sensor pertaining to the present exemplary embodiment, one arbitrary pair of the first fuses and the second fuses is cut and one pair of the third metal fuses and the fourth metal fuses is cut to increase the total area coefficient m and adjust the photocurrent value that is outputted such that it becomes lower than the rated value, so variations in spectral sensitivity resulting from variations in the manufacturing process of the infrared photodiodes and the photodiodes can be controlled, a spectral sensitivity characteristic close to the visual sensitivity characteristic of humans can be obtained, and the value of the total area coefficient m that has been lowered once can again be raised, so even higher precision adjustment becomes possible.

Figure 12:
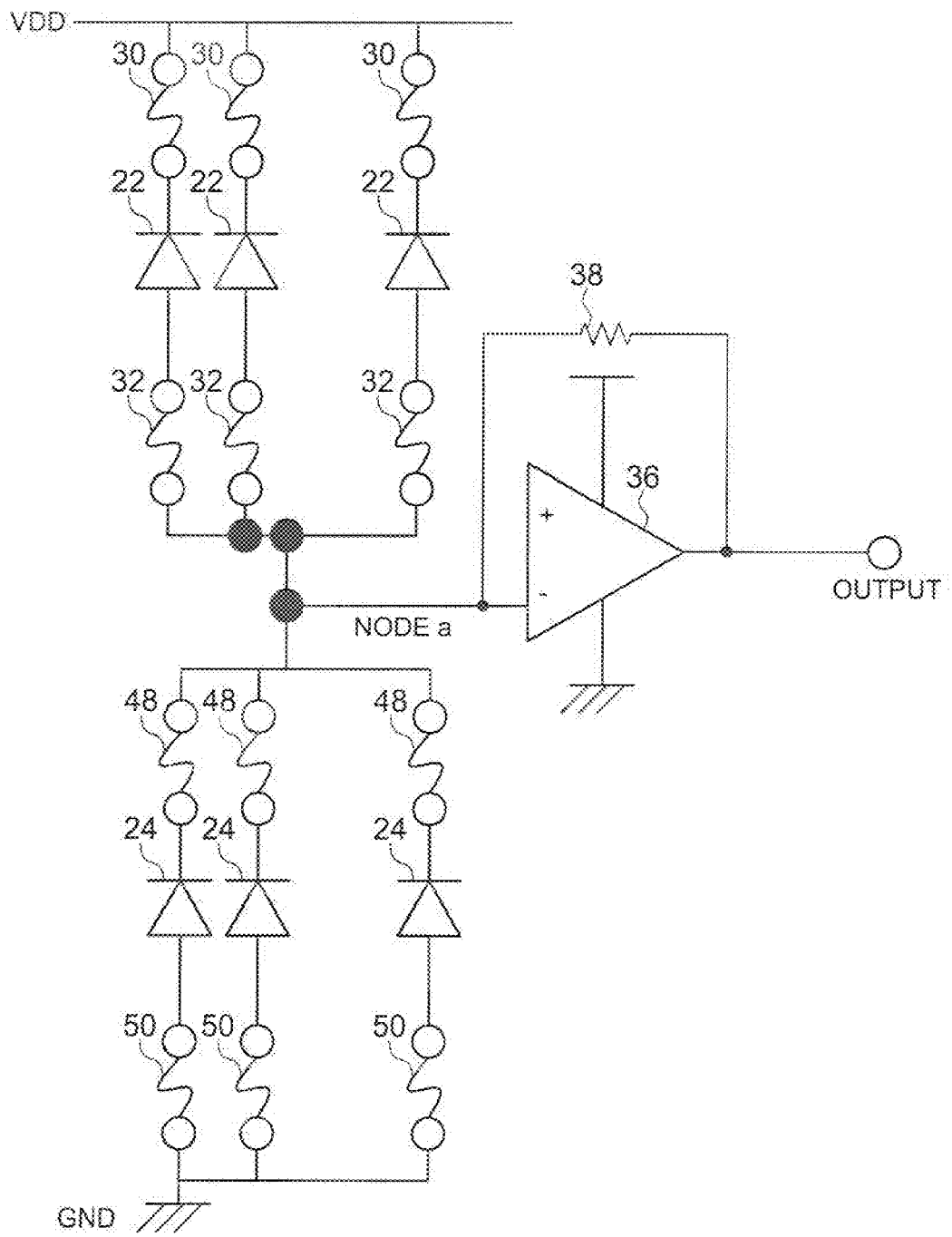
FIG. 12 is a diagram showing a modification of the visible-region light measuring instrument pertaining to the third exemplary embodiment.

It will be noted that, in the present exemplary embodiment, a case has been described where the first metal fuses 30 are connected to the cathodes of the infrared photodiodes 22, the second metal fuses 32 are connected to the anodes of the infrared photodiodes 22, the third metal fuses 48 are connected to the cathodes of the photodiodes 24 and the fourth metal fuses 50 are connected to the anodes of the photodiodes 24. However, just one of either the first metal fuses 30 or the second metal fuses 32 may be connected to the infrared photodiodes 22 and just one of either the third metal fuses 48 or the fourth metal fuses 50 may be connected to the photodiodes 24. For example, as shown in FIG. 12, the first metal fuses 30 may be connected to the cathodes of the infrared photodiodes 22, the cathodes of the photodiodes 24 may be connected to the anodes of the infrared photodiodes 22, and the fourth metal fuses 50 may be connected to the anodes of the photodiodes 24.

Further, in the present exemplary embodiment, a case has been described where the number of the photodiodes 24 and the number of the infrared photodiodes 22 are the same, but the number of the photodiodes 24 may differ from the number of the infrared photodiodes 22. For example, one of the infrared photodiodes 22 may be used, three of the photodiodes 24 may be used, the cathode of the infrared photodiode 22 may be connected to the power supply node VDD, and the anode of the infrared photodiode 22 may be connected to the node a.

In the present exemplary embodiment, the logarithmic converter circuit 42 described in the second exemplary embodiment may be used instead of the current amplifier circuit 14.

Further, the PN junction areas of the photodiodes 24 may be all the same or respectively different.

It will be noted that, in the first exemplary embodiment to the third exemplary embodiment, the PN junction areas of the infrared photodiodes 22 may be all the same.

Following from the above description and embodiments, it should be apparent to those of ordinary skill in the art that, while the methods and apparatuses herein described constitute exemplary embodiments of the present disclosure, the invention is not necessarily limited to the precise embodiments and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the disclosure discussed herein in order to fall within the scope of any claims, since the invention is defined by the claims and since inherent and/or unforeseen advantages of the present invention may exist even though they may not have been explicitly discussed herein.

What is claimed is:

1. A visible-region light measuring instrument comprising:
   a plurality of first photodiodes that are electrically connected between a first node and a first power supply node and has spectral sensitivity in the infrared region; and
   a second photodiode that is electrically connected between the first node and a second power supply node and whose spectral sensitivity in the visible region is greater than its spectral sensitivity in the infrared region,
   wherein
   the visible-region light measuring instrument has first fuses that control connections between the first plurality of photodiodes and at least one of the first node and the first power supply node.

2. The visible-region light measuring instrument according to claim 1, wherein:
   anodes of the first plurality of photodiodes are connected to the first node;
   a cathode of the second photodiode is connected to the first node and an anode of the second photodiode is connected to the second power supply node; and
   one end of each of the first fuses is connected to cathodes of the first photodiodes and the other end of each of the first fuses is connected to the first power supply node.

3. The visible-region light measuring instrument according to claim 1, wherein:
   cathodes of the first plurality of photodiodes are connected to the first power supply node;
   a cathode of the second photodiode is connected to the first node and an anode of the second photodiode is connected to the second power supply node; and
   one end of each of the first fuses is connected to anodes of the first plurality of photodiodes and the other end of each of the first fuses is connected to the first node.

4. The visible-region light measuring instrument according to claim 1, wherein:
   a cathode of the second photodiode is connected to the first node and an anode of the second photodiode is connected to the second power supply node; and
   one end of each of the first fuses is connected to cathodes of the first plurality of photodiodes and the other end of each of the first fuses is connected to the first power supply node, and the one end of each is connected to anodes of the first plurality of photodiodes and the other end of each is connected to the first node.

5. The visible-region light measuring instrument according to claim 1, wherein:

the second photodiode comprises a plurality of second photodiodes that are electrically connected between the first node and a second power supply node and whose spectral sensitivity in the visible region is greater than its spectral sensitivity in the infrared region;

the visible-region light measuring instrument has second fuses that control connections between the second plurality of photodiodes and at least one of the first node and the second power supply node;

anodes of the first plurality of photodiodes are connected to the first node;

one end of each of the first fuses is connected to cathodes of the first plurality of photodiodes and the other end of each of the first fuses is connected to the first power supply node; and one end of each of the second fuses is connected to cathodes of the second plurality of photodiodes and the other end of each of the second fuses is connected to the first node, and the one end of each is connected to anodes of the second plurality of photodiodes and the other end of each is connected to the second power supply node.

6. The visible-region light measuring instrument according to claim 1, wherein:

the second photodiode comprises a plurality of second photodiodes that are electrically connected between the first node and a second power supply node and whose spectral sensitivity in the visible region is greater than its spectral sensitivity in the infrared region;

the visible-region light measuring instrument has second fuses that control connections between the second plurality of photodiodes and at least one of the first node and the second power supply node;

cathodes of the first plurality of photodiodes are connected to the first power supply node;

one end of each of the first fuses is connected to anodes of the first plurality of photodiodes and the other end of each of the first fuses is connected to the first node; and one end of each of the second fuses is connected to cathodes of the second plurality of photodiodes and the other end of each of the second fuses is connected to the first node, and the one end of each is connected to anodes of the second plurality of photodiodes and the other end of each is connected to the second power supply node.

7. The visible-region light measuring instrument according to claim 1, wherein:

the second photodiode comprises a plurality of second photodiodes that are electrically connected between the first node and a second power supply node and whose spectral sensitivity in the visible region is greater than its spectral sensitivity in the infrared region;

the visible-region light measuring instrument has second fuses that control connections between the second plurality of photodiodes and at least one of the first node and the second power supply node;

one end of each of the first fuses is connected to cathodes of the first plurality of photodiodes and the other end of each of the first fuses is connected to the first power supply node, and the one end of each is connected to anodes of the first plurality of photodiodes and the other end of each is connected to the first node; and one end of each of the second fuses is connected to cathodes of the second plurality of photodiodes and the other end of each of the second fuses is connected to the first node, and the one end of each is connected to anodes of the second plurality of photodiodes and the other end of each is connected to the second power supply node.

8. The visible-region light measuring instrument according to claim 1, wherein:

the second photodiode comprises a plurality of second photodiodes that are electrically connected between the first node and a second power supply node and whose spectral sensitivity in the visible region is greater than its spectral sensitivity in the infrared region;

the visible-region light measuring instrument has second fuses that control connections between the second plurality of photodiodes and at least one of the first node and the second power supply node; and further comprising a logic circuit that amplifies currents generated from the first plurality of photodiodes and the second plurality of photodiodes, wherein the first fuses are connected to the first plurality of photodiodes, the second fuses are connected to the second plurality of photodiodes, and the first fuses and the second fuses are disposed between the first plurality of photodiodes and the second plurality of photodiodes and the logic circuit.

9. The visible-region light measuring instrument according to claim 8, further comprising a light-blocking metal that is disposed so as to cover the logic circuit, the first fuses and the second fuses and blocks light with which the visible-region light measuring instrument is irradiated from the outside.

10. The visible-region light measuring instrument according to claim 9, wherein:

the light-blocking metal has openings in positions corresponding to between the first plurality of photodiodes and the second plurality of photodiodes and the logic circuit; and the first fuses and the second fuses are disposed in positions corresponding to the openings in the light-blocking metal.

11. The visible-region light measuring instrument according to claim 10, further comprising a contact metal that is disposed in a position corresponding to the light-blocking metal and blocks light from the outside that is made incident diagonally with respect to the openings in the light-blocking metal.

12. A visible-region light measuring instrument comprising:

a first photodiode that is electrically connected between a first node and a first power supply node and has spectral sensitivity in the infrared region; and a plurality of second photodiodes that are electrically connected between the first node and a second power supply node and whose spectral sensitivity in the visible region is greater than its spectral sensitivity in the infrared region, wherein the visible-region light measuring instrument has second fuses that control connections between the second plurality of photodiodes and at least one of the first node and the second power supply node.

13. The visible-region light measuring instrument according to claim 12, wherein:

an anode of the first photodiode is connected to the first node and a cathode of the first photodiode is connected to the first power supply node;

anodes of the second plurality of photodiodes are connected to the second power supply node; and one end of each of the second fuses is connected to cathodes of the second plurality of photodiodes and other end of each of the second fuses is connected to the first node.

14. The visible-region light measuring instrument according to claim 12, wherein:

an anode of the first photodiode is connected to the first node and a cathode of the first photodiode is connected to the first power supply node;

cathodes of the second plurality of photodiodes are connected to the first node; and one end of each of the second fuses is connected to anodes of the second plurality of photodiodes and the other end of each of the second fuses is connected to the second power supply node.

15. The visible-region light measuring instrument according to claim 12, wherein:

an anode of the first photodiode is connected to the first node and a cathode of the first photodiode is connected to the first power supply node; and one end of each of the second fuses is connected to cathodes of the second photodiodes and the other end of each of the second fuses is connected to the first node, and the one end of each is connected to anodes of the second plurality of photodiodes and the other end of each is connected to the second power supply node.

* * * * *